United States Patent
Whitley

(10) Patent No.: US 6,763,054 B2
(45) Date of Patent: Jul. 13, 2004

(54) OPTICAL SYSTEM FOR IMPROVING THE BRIGHTNESS OF A STACK OF LENSED DIODE LASERS

(75) Inventor: Richard M. Whitley, West Hills, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/299,472

(22) Filed: Nov. 19, 2002

(65) Prior Publication Data

US 2004/0095983 A1 May 20, 2004

(51) Int. Cl.[7] ................................................. H01S 3/08
(52) U.S. Cl. ........................ 372/102; 372/19; 372/23; 372/29.014; 372/96; 372/97
(58) Field of Search ................................ 372/9, 19, 23, 372/29.01, 29.011, 29.014, 92, 96, 97, 101, 102, 108; 359/726–736

(56) References Cited

U.S. PATENT DOCUMENTS

| 4,905,252 A | * | 2/1990 | Goldberg et al. ............. 372/94 |
| 4,995,050 A | | 2/1991 | Waarts et al. |
| 5,386,426 A | * | 1/1995 | Stephens ...................... 372/20 |
| 5,430,748 A | * | 7/1995 | MacCormack et al. ....... 372/29 |
| 5,572,542 A | * | 11/1996 | Dixon .......................... 372/92 |
| 6,167,075 A | * | 12/2000 | Craig et al. ................... 372/75 |
| 6,212,216 B1 | * | 4/2001 | Pillai ............................ 372/96 |
| 6,219,187 B1 | * | 4/2001 | Hwu et al. .................. 359/627 |
| 6,229,940 B1 | * | 5/2001 | Rice et al. ..................... 385/33 |
| 6,327,292 B1 | | 12/2001 | Sanchez-Rubio et al. |
| 6,356,576 B1 | * | 3/2002 | Smith .......................... 372/102 |

* cited by examiner

Primary Examiner—David Porta
Assistant Examiner—Davienne Monbleau
(74) Attorney, Agent, or Firm—Ingrassia Fisher & Lorenz, P.C.

(57) ABSTRACT

The optical system includes a stack of lensed, AR-coated laser diode bars and optics to brighten the stack's output. A spatial filter forces each bar to lase in one or a few high-order modes having two strong emission lobes. Radiation in the first lobe is passed to a collimating optic to form a filtered image of each of the lensed diode bars on an associated grating, whose angle then determines the lasing wavelength of that bar. Radiation in the second lobe is directed into an output path where another collimating optic produces an array of spatially separated, collimated beams. The wavelengths set for each beam allow them to be spectrally combined into a single, multi-wavelength, collimated output beam possessing substantially the same cross section and divergence as an individual input beam.

26 Claims, 3 Drawing Sheets

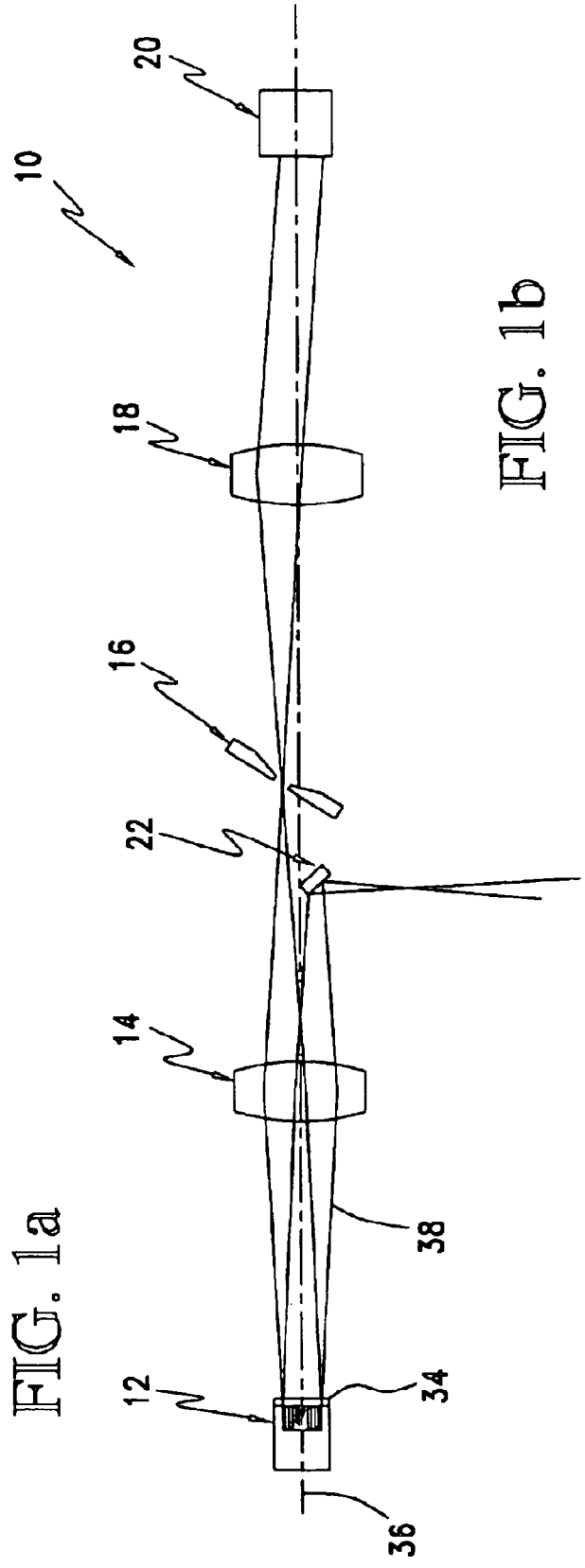
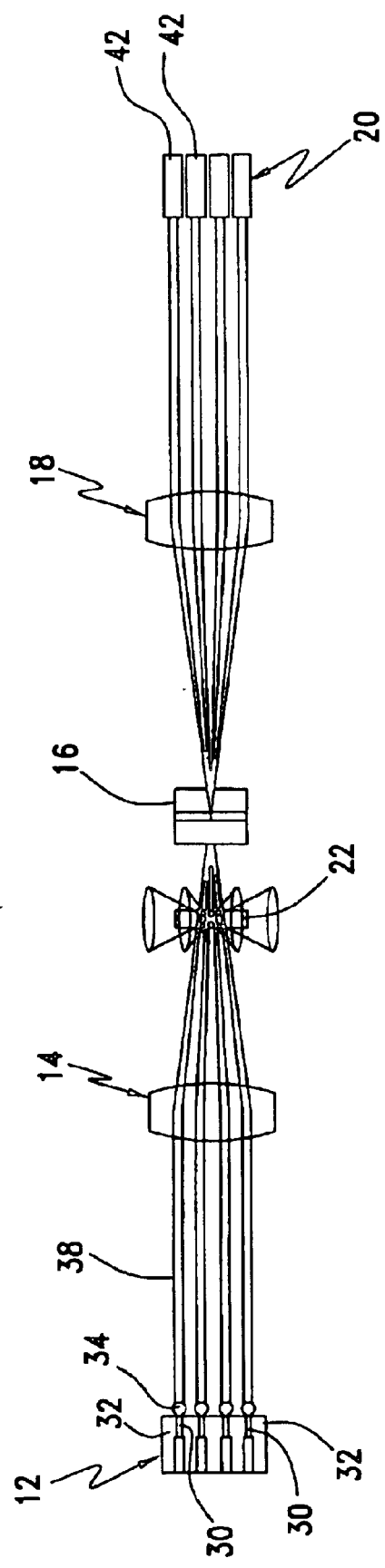

OPTICAL SYSTEM FOR IMPROVING THE BRIGHTNESS OF A STACK OF LENSED DIODE LASERS

BACKGROUND OF THE INVENTION

1. Field of the Invention

The present invention relates generally to the field of external cavity laser diode sources and more particularly, the invention relates to efficient high-power, high-brightness, multi-wavelength external cavity laser sources that use simultaneous spatial-filtering and wavelength selection of each laser bar in a stack to brighten the output of the stack.

2. Description of the Related Art

High-power and high-brightness semiconductor laser sources which have high efficiency are desirable for a variety of applications including machining operations such as cutting and welding, as well as optically pumping other lasers. Current high-power diode laser sources are severely limited in their machining capabilities by the low brightness of their output beams. Although their excellent energy efficiency makes high-power diode laser arrays attractive for laser pumping, their low brightness is also a limitation here for certain laser geometries. For example, prior methods of pumping small-diameter rod lasers and fiber lasers required the use of specialized and expensive optics to obtain reasonable coupling efficiencies.

External cavities have been used to brighten the output of broad-area diode lasers. These have been relatively low power devices with outputs of a few Watts. In contrast, diode laser bars and stacks of bars are high-power sources with outputs ranging from about 30 Watts up to a few kilowatts. If their outputs can be similarly brightened without significantly decreasing output power, these devices should find additional demand, not only in the areas given above, but also in new applications.

U.S. Pat. No. 4,995,050, issued to R. G. Waarts et al., discloses a diode laser external lens cavity configuration having a stripe mirror with two thin parallel stripes placed in front of the two lobes of the array's far field output pattern. The configuration includes a diode laser array or broad area laser, a lens system, such as a graded-index lens, disposed in front of the laser's front light emitting facet and the stripe mirror disposed in front of the lens system at the focal plane of the lens. The two stripes are parallel to one another on opposite sides of and equidistant from a vertical reference plane through the lens' center axis. One stripe is highly reflective, while the other is effectively only partially reflective having either a lower stripe reflectivity or shorter length than the first stripe. Other embodiments include a third stripe spaced from and collinear with the second stripe to form an etalon, and a grating in the cavity. Although the '050 patent involves spatial-filtering the output of a bar, it does not address the problem of combining the outputs of multiple bars.

U.S. Pat. No. 6,327,292 B1, issued to Sanchez-Rubio et al., discloses a free space external cavity multi-wavelength laser that includes a free-space external cavity and a two-dimensional laser array. The two-dimensional laser array includes a plurality of optical gain elements where each optical gain element generates optical radiation having a unique wavelength and a unique free space optical path. The laser also includes a two-dimensional dispersive optical system that spatially and angularly overlaps each of the free space optical paths in two dimensions. The laser also includes a partially reflecting element that is positioned to intercept each of the free space optical paths. The partially reflecting element, a reflector on each gain element, and the two-dimensional dispersive optical system together form a free space laser cavity that defines the unique wavelengths. The partially reflecting element transmits an overlapping beam comprising radiation having the unique wavelengths. The '292 does not involve trying to simultaneously brighten the individual sources.

SUMMARY

The present invention is an optical system for improving the brightness of a stack of lensed diode bars. It includes a diode bar assembly comprising a stack of lensed diode bars. Front faces of the diode bars have anti-reflection coatings thereon. The diode bar assembly provides an output along an optical axis. The output comprises a plurality of modes in the slow axis, and is collimated in the fast axis and diverging in the slow axis. A focusing optic is positioned so that the front focal plane thereof is coincident with the front faces of the stack of lensed diode bars. A far field pattern comprising primarily two focused spots on opposite sides of the optical axis is produced in the back focal plane of the focusing optic for each of the modes in the output of the diode bars. The spots correspond to the first and second predominant lobes in the mode's output pattern. A spatial filter is positioned in the back focal plane for discriminating against modes outside a selected modal region of $N_0$ by passing the radiation in the first lobe of the output from the selected modal region of $N_0$. A collimating optic collects radiation passed by the spatial filter and collimates the radiation from the first lobe of the selected modal region. The collimating optic is positioned so as to form, in combination with the focusing optic, a telecentric relay, so that a filtered image of the stack of lensed diode bars is formed at a back focal plane of the collimating optic. A settable grating array comprises a plurality of gratings. The number of the gratings is at least as large as the number of the lensed diode bars. A filtered image of each of the lensed diode bars falls on an associated grating, the angle set for the grating determining which wavelength in the filtered image is returned back through the spatial filter into the lensed diode bar from which it was emitted. An output pickoff element is positioned between the focusing optic and the back focal plane of the focusing optic for turning light from the second lobe of the radiation pattern from the selected modal region into an output path. The light converges toward a focused spot in the back focal plane of the focusing optic before being turned. An output collimating optic in the output path receives the turned light and producing an array of spatially separated, collimated output beams of the turned light. The radiation in each of the beams comes from a corresponding diode bar in the diode laser stack. A wavelength combining assembly receives as input the spatially separated collimated output beams from the output collimating element and overlaps them to form a single, multi-wavelength, collimated beam possessing substantially the same cross section and divergence as an individual input beam. Thus, the stack of laser bars are brightened by simultaneously spatial-filtering each laser bar to brighten its output and setting its spectral wavelength so that it can be spectrally combined with the outputs of the other laser bars.

The invention utilizes a stack of diode laser bars and external resonator optics that act to brighten the output of the stack in the along-junction direction. In the direction perpendicular to the junction in a laser bar (the fast axis) the active region is so thin (sub-micron) that only one mode is typically supported. In the along-junction direction (the slow axis), on the other hand, the power is generally distributed among thousands of modes, producing a radiation output pattern with a divergence more than a thousand times diffraction-limited. Despite the high power obtainable from a single bar (which can be 100 W or more), the excessive divergence (also referred to as the low brightness) of the output can make it unsuitable for many direct applications such as welding and cutting. The low brightness of such laser sources also makes it more difficult to use their output as a pump for some solid state laser geometries.

In this invention the output face of each laser bar is antireflection coated so that it no longer defines the laser cavity. Instead, each bar is placed in an external cavity, which 1) by discriminating against unwanted modes, feeds the power in a much reduced number of modes back into the active medium to brighten the output of the bar, and 2) selects the lasing wavelength of each bar so that the beams from each bar in the stack can be overlapped in space through an external wavelength combining assembly. The greatly improved brightness of the output of a stack of laser bars provided by this invention simplifies their use as pump sources and increases their utility for applications, such as cutting and welding, that require a beam which is both bright and has high power.

Other objects, advantages, and novel features will become apparent from the following detailed description of the invention when considered in conjunction with the accompanying drawings.

BRIEF DESCRIPTION OF THE DRAWINGS

FIG. 1a is a top view schematic of the optical system of the present invention showing the laser diode stack and the external cavity with its mode- and wavelength-selecting optics.

FIG. 1b is a side view schematic of the optical system of the present invention showing the laser diode stack and the external cavity with its mode- and wavelength-selecting optics

The same parts or elements throughout the drawings are designated by the same reference characters.

DETAILED DESCRIPTION OF THE INVENTION

Figure 2:
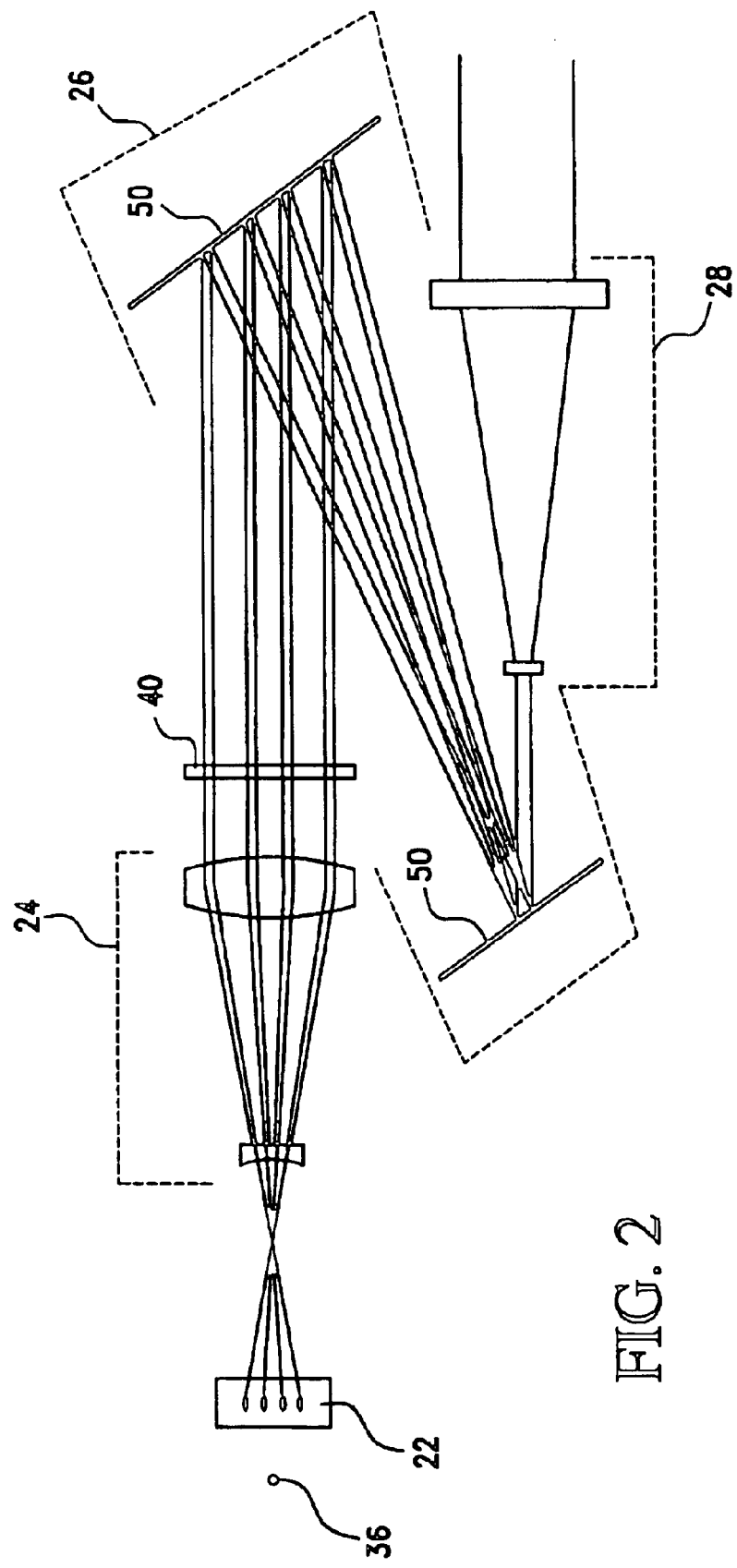
FIG. 2 is side view schematic illustrating the optics comprising the output path. Since the output path has been turned 90 degrees from the optical axis, the axis seen as a line in FIG. 1a is perpendicular to the plane of this figure.

Referring now to the drawings and the characters of reference marked thereon, FIGS. 1 and 2 together illustrate a first preferred embodiment of the optical system of the present invention, designated generally as 10. The optical system includes the following assemblies: a lensed diode bar assembly 12; a focusing optic 14; a spatial filter 16; a collimating optic 18; a settable grating array 20; an output pickoff element 22; an output collimating optical assembly 24; an output feedback element 40; a wavelength-combining assembly 26; and, an anamorphic expander telescope 28.

1. Lensed Diode Bar Assembly

The stack of diode bars 30 comprises the active medium for this optical system 10. The lensed diode bar assembly 12 includes the stack of laser diode bars 30, fitted with cylindrical lenses 34 that collimate the light in the fast axis (that is, the nearly diffraction-limited light diverging in a plane perpendicular to the junction), and mounted on heat sinks 32 which preferably are actively cooled for continuous operation. This stack differs from the usual commercially available stack in that an antireflection coating has been applied to the front face or facet of each of the laser diode bars. Thus, light traveling forward in the active medium does not experience a significant reflection when it encounters this face, but is transmitted through it. The portion and character of this transmitted light that is fed back into the active medium is determined by the external optics. It is noted that the word "light" as used herein refers broadly to radiation, whether visible or not.

A typical diode bar is 0.5 to 2.0 mm in depth and has a width D of 10 to 20 mm. The external cavity is designed to force this active medium to oscillate in a high-order mode in which the emitted wave has a phase that changes sign N times along the width of the output face. Typically D/N will be on the order of 10 microns, and diode bars 30 whose current contact is an array of stripes having approximately the same value as D/N for their center-to-center spacing are preferred. Typically, the bars 30 in the stack 12 will have a minimum junction-to-junction spacing, limited by the thickness of the heat sinks 32 or the heights of the cylindrical lenses 34, of between 1 and 2 mm. In the figure a 4-bar stack is shown, although the stack could consist of a much larger number of bars. Output powers on the order of 50 W may be obtained from a stack consisting of a single bar, while kilowatt level outputs may require a stack of 20 bars or more. The limits on the number of bars in a single stack are set by practical issues such as the diameters of the optics in the external cavity and the power densities where the beams from the separate bars overlap.

2. Focusing Optic

The output 38 from the lensed diode stack 12 is collimated in the fast axis, but is diverging in the slow axis, as is illustrated in the two views of this output, FIGS. 1a and 1b. The mode characterized by the integer N, defined above, will have two strong emission lobes in the plane of the junction, which we denote as the first, or left, lobe and the second, or right, lobe. These make angles of $\pm \lambda N/2D$ (radians) with the optical axis 36, where the plus sign corresponds to the first (left) lobe and the minus sign to the second (right). The wavelength of the emitted light has been denoted by $\lambda$. The focusing optic 14, with an effective focal length of F, is positioned so that its front focal plane is coincident with the front of the diode stack 12. Then, the far field pattern will be produced in its back focal plane. For the mode N, this will consist of two spots, corresponding to the first and second lobes, focused on opposite sides of the optical axis and a distance of $\lambda NF/2D$ from it. For example, if $\lambda$ is 0.8 microns, 2D/N is 0.020 mm, and F is 250 mm, then the two main lobes focus 10 mm from the optical axis.

The focusing optic 14 may comprise refractive elements (i.e. lenses), reflective elements (i.e. mirrors), or catadioptric elements (combinations of refractive and reflective elements used together), as is well known to those skilled in this field.

In the absence of any discrimination between the modes, one obtains power in all modes from N=0 up to several thousand. This is the situation in the commercially available diode stacks, and the result is a multi-mode output beam with a broad divergence in the slow-axis (i.e., in the plane of the junction) of 5 to 10 degrees from a bar 10 mm wide. The focusing optic 14 provides a location (its back focal plane)

where every mode's left lobe can be spatially filtered to produce large losses for all modes outside the region of $N_0$. As used herein the term "the region of $N_0$" means the mode $N_0$ and possibly a small number of neighboring modes. The opposite side of the optical axis, where the second lobes are focused, provides a location where the power can be extracted from the cavity, once it is moved to a more accessible position by the pick-off element 22.

3. Spatial Filter

The spatial filter 16 is located in the back focal plane of the focusing optic 14. Its purpose is to introduce high losses in the path from the diode bar to the grating array and back for the unwanted modes and low losses for the desired mode(s) in the region of $N_0$. Since the main lobes of each mode focus at a different distance from the optical axis in the back focal plane of the focusing optic 14, with that distance given by the mode number N times $\lambda F/2D$, a spatial filter in the form of a vertical slit centered at a distance of $\lambda N_0 F/2D$ from the optical axis 36 will provide the desired discrimination against the modes outside the region of $N_0$.

The focal spot at the spatial filter 16 will be asymmetric. The cylindrical lens 34 on the diode bar 30 produces a beam with a typical height h of 0.5 to 1.0 mm collimated in the vertical direction, so the vertical extent of the focal spot will be on the order of $2\lambda F/h$. The horizontal extent of this spot for any given single mode will be much less, on the order of $2\lambda F/D$. For example, if $\lambda$ is 0.8 microns, D is 10 mm, h is 0.5 mm, and F is 250 mm, then the spot will be about 0.8 mm high by about 0.04 mm wide. Note that the radiation that is fed back into the diode laser must pass through the spatial filter 16 twice, once in each direction. The slit's width must be set so that the desired mode(s) in the region of $N_0$ suffer much less attenuation from the double pass through the slit than do the unwanted modes.

As the number of bars 30 in the stack 12 is increased, the power density at the spatial filter 16 increases proportionately. The spatial filter 16 must be designed to handle the power that it removes from the beam, by reflecting it to a dump outside the cavity, absorbing it, or some combination of the two.

4. Collimating Optic

The collimating optic 18 collects the radiation passed by the spatial filter 16 and collimates it. The collimating optic 18 may comprise refractive elements, reflective elements or combinations thereof, as discussed above with respect to the focusing optic 14. It is positioned so that the spatial filter 16 is in its front focal plane. Since the separation of collimating optic 18 from the focusing optic 14 is such that its front focal plane coincides with the back focal plane of optic 14, these two optical elements together form a telecentric relay. An image of the radiation distribution from each lensed diode bar in the stack 12 in the front focal plane of the focusing optic 14 is formed in the back focal plane of the collimating optic 18, modified by the spatial filter 16 in the transform plane. Thus, if the stack 12 comprises four bars 30, the filtered image in the back focal plane of the collimating optic 18 will comprise four bright bars, inverted with respect to the object. Because the relay is telecentric, plane waves in object space are also plane waves in image space.

Similarly, radiation returning from image space through the telecentric relay will form another image at the location of the original object. The magnification of this image is one, i.e., it is the same size and orientation as the original object. (Of course, only that light from the image that is passed by the spatial filter 16 on its return trip can reach the plane of the lensed diode bars 30 to form this image.)

5. Settable Grating Array

An important aspect of the invention is the settable grating array 20. This array comprises a number of gratings at least equal to the number of bars 30 in the laser diode stack 12. The array 20 is sized and positioned in the back focal plane of the collimating optic 18 so that the image of each bar 30 falls on the grating 44 covering the front face of its own associated grating element 42. The gratings 44 in the array 20 are preferably identical. They are used in the Littrow configuration, where the desired wavelength is diffracted back on itself. For greatest efficiency the gratings 44 should be blazed for the center wavelength.

Figure 3C:
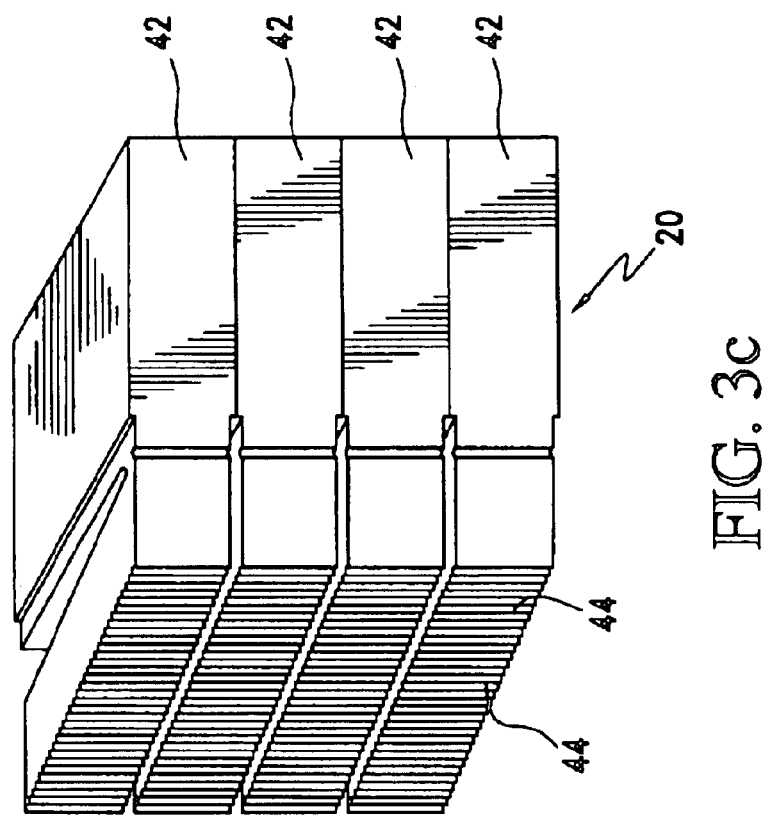
FIG. 3c is a perspective view showing the grating faces of a settable grating array having four grating elements.
Figure 3A:
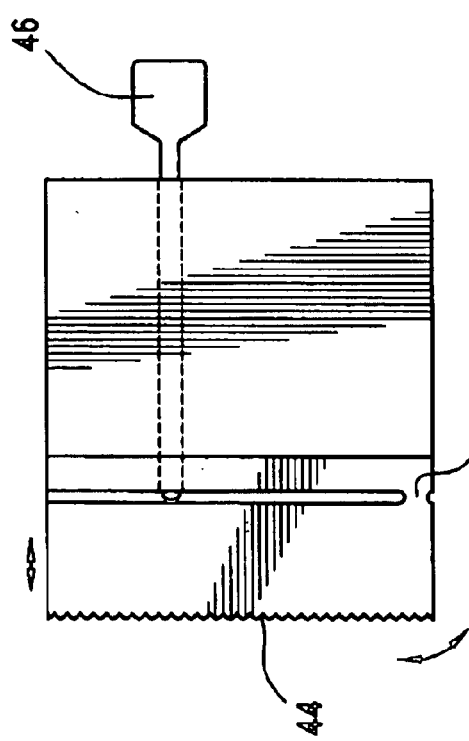
FIG. 3a is a top view illustrating a concept for the settable grating element in the grating array of the optical system.
Figure 3B:
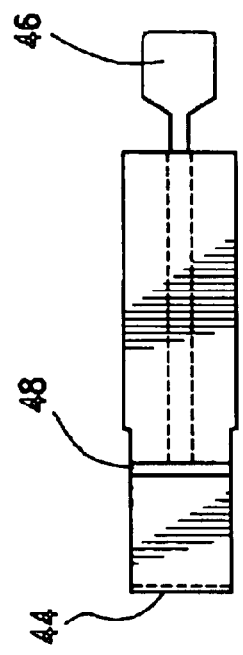
FIG. 3b is a side view illustration of a single grating element in the settable grating array.

The grating elements 42 are stacked in a vertical array, as shown in FIG. 3c. The resulting vertical spacing of the gratings 44 is such that it matches the spacing of the laser diode bars 30 in the stack image, and the lines of gratings 44 are vertical so that different wavelengths are diffracted horizontally, in the plane of the junction and in a line perpendicular to the slit opening of the spatial filter 16. The angle that the plane of each grating 44 in the array 20 makes with the optical axis 36 can be adjusted separately. Setting this angle determines, for the corresponding laser bar 30, the wavelength that returns through the center of the slit and consequently suffers the least attenuation from the spatial filter 16, i.e., the central lasing wavelength for that bar 30. The wavelengths of the different laser bars 30 should be chosen to allow the output beams to be overlapped in space by the wavelength combining assembly. (A concept for this assembly is shown in FIG. 2.) The actual angle differences between the different gratings 44 in the array are very small and will depend on the diode stack dimensions, the effective focal lengths of the focusing optic 14 and the collimating optic 18, and the design of the wavelength combining assembly 26. The angle-adjustment mechanism 46 shown in FIG. 3 as a screw which rotates the grating about the pivot point 48 is meant to be schematic and conceptual. The desired motion may be obtained by a number of different means, for example, by double screws, by inchworm-type micrometers, or by piezo-electric translators, and other geometries providing the angle sensitivity required may be employed. The adjustment mechanism must only be able to set the angle of the grating 44 to the required precision and provide the grating element 42 with the stability to maintain this angle during operation of the laser.

6. Output Pickoff Element

The two-lobed output of the mode N was discussed above. The first (left) lobe focuses "above" (in FIG. 1a) the optical axis 36 and is spatially filtered and spectrally selected before being fed back into the diode laser bar 30 from which it was emitted. The second (right) lobe, which focuses "below" the optical axis 36, is turned "downward" by the pickoff element 22 and sent to the output path optics, shown in FIG. 2. This element 22 is positioned between the focusing optic 14 and its back focal plane. It should be as far away from the back focal plane as possible to minimize the flux density at the element, but it cannot be so close to the focusing optic 14 that there is insufficient clearance for the edge of the element between the two focusing lobes. The output pickoff element may be, for example, a mirror or a prism used with internal reflection.

7. Output Collimating Assembly

After reflecting from the output pickoff element 22, the radiation is then recollimated by the output collimating assembly 24. A long effective focal length is desirable for this optical element, since that enlarges the beam footprint on the components of the wavelength combining assembly 26 and reduces the power density there. For this reason this output collimating assembly 24 has been shown in FIG. 2 as a telephoto design, which packages a long focal length into a smaller physical length. As discussed above with respect to the focusing optic 14 and the collimating optic 18, the output collimating assembly 24 may comprise refractive elements, reflective elements, or combinations thereof.

8. Output Feedback Element

The output feedback element 40 provides a capability for returning a fraction of the power in the second lobe, the output lobe, back into the lasing medium. Under some conditions this feedback is not necessary for the operation of the present invention, and under these conditions the feedback element 40 may be removed. In the position shown, in collimated space following the output collimating assembly 24, feedback element 40 takes the form of a partially reflecting plane surface. Its form will change depending on its position in the output path. For example, if placed before the output collimating assembly 24, feedback element 40 would take the form of a partially reflecting spherical surface.

9. Wavelength Combining Assembly

The wavelength combining assembly 26 accepts the spatially separated but parallel collimated beams provided by the output collimating assembly 24 and spectrally combines them into a single collimated beam. Assembly 26 preferably comprises a grating rhomb as illustrated in FIG. 2. The grating rhomb comprises two preferably identical gratings 50 mounted so that their surfaces as well as their grooves are parallel. The gratings 50 shown in FIG. 2 have grooves running perpendicular to the plane of the drawing. A reflecting grating rhomb has the property that a beam of any wavelength, after diffracting from both gratings, is traveling parallel to its initial direction. Thus, it can be used to superpose a linear array of parallel beams, if their wavelengths are chosen precisely so that, after diffracting from the first grating, all the beams share a common area of interception with the second grating. The settable grating array 20, discussed above, is the means for choosing the wavelength for each beam so that this condition is satisfied. A transmissive grating element may substitute for one or both of the reflecting gratings 50 in the grating rhomb. Whether reflective or transmissive, the rhomb gratings 50 should be blazed to maximize throughput and minimize the power in the unwanted orders that must be contained. Alternatively, the wavelength combining assembly may comprise an array of narrowband spectral filters.

10. Anamorphic Expander Telescope

The beam leaving the wavelength combining assembly 26 has a very nonsymmetrical cross section. For the example discussed with the spatial filter, the output beam shown in FIG. 2 would have a width (into the plane of the drawing) 20 times its height. A beam expander 28 that includes cylindrical optics can magnify the height of the beam by a different factor than it magnifies the width so that the beam dimension in the two principal transverse directions is the same. This change makes the use of conventional circular aperture optics for relaying and focusing the beam more convenient. If the spatial filtering produces a single mode or almost single mode in the along-junction direction, this anamorphic beam expansion will also cause the beam divergences in the two orthogonal directions to more closely match.

Obviously, many modifications and variations of the present invention are possible in light of the above teachings. It is, therefore, to be understood that within the scope of the appended claims, the invention may be practiced otherwise than as specifically described.

What is claimed and desired to be secured by Letters Patent of the United States is:

1. An optical system for improving the brightness of a stack of lensed diode bars, comprising:
    a) a diode assembly comprising a stack of lensed diode bars, front faces of said diode bars having antireflection coatings thereon, said diode bar assembly providing an output along an optical axis, said output comprising a plurality of modes in the slow axis, and being collimated in the fast axis and diverging in the slow axis
    b) a focusing optic being positioned so that the front focal plane thereof is coincident with said front faces of said stack of lensed diode bars, a far field pattern comprising primarily two focused spots on opposite sides of the optical axis being produced in the back focal plane of said focusing optic for each of said modes in the output of said diode bars, said spots corresponding to the first and second predominant lobes in said mode's output pattern;
    c) a spatial filter positioned in said back focal plane for discriminating against modes outside a selected modal region of $N_0$ by passing the radiation in said first lobe of the output from said selected modal region of $N_0$;
    d) a collimating optic for collecting radiation passed by said spatial filter and collimating said radiation from said first lobe of said selected modal region, said collimating optic being positioned so as to form, in combination with said focusing optic, a telecentric relay, so that a filtered image of said stack of lensed diode bar is formed at a back focal plane of said collimating optic;
    e) a settable grating array comprising a plurality of gratings, the number of said gratings being at least as large as the number of said lensed diode bars, wherein a filtered image of each of said lensed diode bars falls on an associated grating, the angle set for said grating determining which wavelength in said filtered image is returned back through the spatial filter into the lensed diode bar from which it was emitted;
    f) an output pickoff element positioned between said focusing optic and said back focal plane of said focusing optic for turning light from said second lobe of the radiation pattern from said selected modal region into an output path, said light converging toward a focused spot in said back focal plane of said focusing optic before being turned;
    g) an output collimating optic in said output path for receiving said turned light and producing an array of spatially separated, collimated output beams of said turned light, the radiation in each of said beams coming from a corresponding diode bar in the diode laser stack; and
    h) a wavelength combining assembly for receiving as input said spatially separated collimated output beams from said output collimating element and overlapping them to form a single, multi-wavelength, collimated beam possessing substantially the same cross section and divergence as an individual input beam;
wherein said stack of laser bars are brightened by simultaneously spatial-filtering each laser bar to brighten its output and setting its spectral wavelength so that it can be spectrally combined with the outputs of said other laser bars.

2. The optical system of claim 1, wherein said focusing optic comprises refractive elements.

3. The optical system of claim 1, wherein said focusing optic comprises reflective elements.

4. The optical system of claim 1, wherein said focusing optic comprises a combination of refractive and reflective elements.

5. The optical system of claim 1, wherein said collimating optic comprises refractive elements.

6. The optical system of claim 1, wherein said collimating optic comprises reflective elements.

7. The optical system of claim 1, wherein said collimating optic comprises a combination of refractive and reflective elements.

8. The optical system of claim 1, wherein said output pickoff element comprises a mirror.

9. The optical system of claim 1, wherein said output pickoff element comprises a prism.

10. The optical system of claim 1, wherein said output collimating optic comprises refractive elements.

11. The optical system of claim 1, wherein said output collimating optic comprises reflective elements.

12. The optical system of claim 1, wherein said output collimating optic comprises a combination of refractive and reflective elements.

13. The optical system of claim 1, wherein said wavelength combining element comprises a reflective grating rhomb.

14. The optical system of claim 1, wherein said wavelength combining element comprises a transmissive grating rhomb.

15. The optical system of claim 1, wherein said wavelength combining element comprises a grating rhomb comprising both reflective and transmissive gratings.

16. The optical system of claim 1, wherein said wavelength combining element comprises an array of spectral filters.

17. The optical system of claim 1, further comprising an output feedback element in the output path for returning a fraction of the radiation coming from each lensed diode laser bar to that same bar in the diode laser stack is needed.

18. The optical system of claim 1, further comprising an output feedback element in the output path for returning a fraction of the radiation coming from each lensed diode laser bar to that same bar in the diode laser stack, said output feedback element being positioned before said output collimating assembly.

19. The optical system of claim 1, further including an anamorphic expander telescope for receiving said single multi-wavelength collimated beam from said wavelength combining assembly and anamorphically magnifying said single beam to provide enhanced matching of the beam width and the beam divergence in the two principal transverse directions of said single, multi-wavelength, collimated beam.

20. The optical system of claim 19, wherein said anamorphic telescope comprises refractive elements.

21. The optical system of claim 19, wherein said anamorphic telescope comprises reflective elements.

22. The optical system of claim 19, wherein said anamorphic telescope comprises a combination of reflective and refractive elements.

23. The optical system of claim 1, wherein said stack of diode bars comprises cylindrical lenses for collimating said output of said diode bar assembly in said fast axis.

24. The optical system of claim 1, wherein said diode bars have depths in a range of 0.5 to 2.0 mm.

25. The optical system of claim 1, wherein said diode bars have widths in a range of 10 to 20 mm.

26. An optical system for improving the brightness of a stack of lensed diode bars of a diode bar assembly, said lensed diode bars having front faces with anti-reflection coatings, said diode bar assembly providing an output along an optical axis, said output comprising a plurality of modes in a slow axis, and being collimated in a fast axis and diverging in said slow axis, said optical system, comprising:

a) a focusing optic being positioned so that the front focal plane thereof is coincident with said front faces of said stack of lensed diode bars, a far field pattern comprising primarily two focused spots on opposite sides of the optical axis being produced in the back focal plane of said focusing optic fro each of said modes in the output of said diode bars, said spots corresponding to the first and second predominant lobes in said mode's output pattern;

b) a spatial filter positioned in said back focal plane for discriminating against modes outside a selected modal region of $N_0$ by passing the radiation in said first lobe of the output from said selected modal region of $N_0$;

c) a collimating optic for collecting radiation passed by said spatial filter and collimating said radiation from said first lobe of said selected modal region, said collimating optic being positioned so as to form, in combination with said focusing optic, a telecentric relay, so that a filtered image of said stack of lensed diode bars is formed at a back focal plane of said collimating optic;

d) a settable grating array comprising a plurality of gratings, the number of said gratings being at least as large as the number of said lensed diode bars, wherein a filtered image of each of said lensed diode bars falls on an associated grating, the angle set for said grating determining which wavelength in said filtered image is returned back through the spatial filter into the lensed diode bar from which it was emitted;

e) an output pickoff element positioned between said focusing optic and said back focal plane of said focusing optic for turning light from said second lobe of the radiation pattern from said selected modal region into an output path, said light converging toward a focused spot in said back focal plane of said focusing optic before being turned;

f) an output collimating optic in said output path for receiving said turned light and producing an array of spatially separated, collimated output beams of said turned light, the radiation in each of said beams coming from a corresponding diode bar in the diode laser stack; and g) a wavelength combining assembly for receiving as input said spatially separated collimated output beams from said output collimating element and overlapping them to form a single, multi-wavelength, collimated beam possessing substantially the same cross section and divergence as an individual input beam;

wherein, said stack of laser bars are brightened by simultaneously spatial-filtering each laser bar to brighten its output and setting its spectral wavelength so that it can be spectrally combined with the outputs of said other laser bars.

* * * * *

UNITED STATES PATENT AND TRADEMARK OFFICE
CERTIFICATE OF CORRECTION

PATENT NO. : 6,763,054 B2
DATED : July 13, 2004
INVENTOR(S) : Richard M. Whitley It is certified that error appears in the above-identified patent and that said Letters Patent is hereby corrected as shown below:

Column 9,
Line 39, delete "is needed";

Column 10,
Line 15, delete "fro" and add -- from --.

Signed and Sealed this

Thirtieth Day of November, 2004

JON W. DUDAS
*Director of the United States Patent and Trademark Office*